US012666700B2

(12) United States Patent
Osaga et al.

(10) Patent No.: US 12,666,700 B2
(45) Date of Patent: Jun. 23, 2026

(54) SEMICONDUCTOR DEVICE

(71) Applicant: Mitsubishi Electric Corporation,
Tokyo (JP)

(72) Inventors: Tsuyoshi Osaga, Tokyo (JP); **Yasuo
Ata, Tokyo (JP); Yuki Hata**, Tokyo
(JP)

(73) Assignee: Mitsubishi Electric Corporation,
Tokyo (JP)

( * ) Notice: Subject to any disclaimer, the term of this
patent is extended or adjusted under 35
U.S.C. 154(b) by 335 days.

(21) Appl. No.: 18/254,665

(22) PCT Filed: Apr. 26, 2021

(86) PCT No.: PCT/JP2021/016615
§ 371 (c)(1),
(2) Date: May 26, 2023

(87) PCT Pub. No.: WO2022/230014
PCT Pub. Date: Nov. 3, 2022

(65) Prior Publication Data
US 2024/0014206 A1      Jan. 11, 2024

(51) Int. Cl.
*H10D 84/60*          (2025.01)
*H10D 8/00*           (2025.01)
*H10D 12/00*          (2025.01)
(52) U.S. Cl.
CPC ........... *H10D 84/617* (2025.01); *H10D 8/422*
(2025.01); *H10D 12/481* (2025.01)
(58) Field of Classification Search
None
See application file for complete search history.

(56) References Cited

U.S. PATENT DOCUMENTS

| | | | |
|---|---|---|---|
| 2009/0057832 A1 | 3/2009 | Kouno | |
| 2009/0114947 A1 | 5/2009 | Fukuda et al. | |

(Continued)

FOREIGN PATENT DOCUMENTS

| | | |
|---|---|---|
| CN | 106030797 A | 10/2016 |
| JP | 2009-135414 A | 6/2009 |

(Continued)

OTHER PUBLICATIONS

International Search Report issued in PCT/JP2021/016615; mailed
Jul. 20, 2021.
An Office Action; "Notice of Reasons for Refusal," mailed by the
Japanese Patent Office on Jul. 23, 2024, which corresponds to
Japanese Patent Application No. 2023-516870 and is related to U.S.
Appl. No. 18/254,665; with English language translation.
An Office Action issued by the German Patent and Trademark Office
on Feb. 24, 2026, which corresponds to German Patent Application
No. 112021007588.8 and is related to U.S. Appl. No. 18/254,665;
with English language translation.

(Continued)

*Primary Examiner* — Bilkis Jahan
(74) *Attorney, Agent, or Firm* — Studebaker Brackett
PLLC

(57) ABSTRACT

An IGBT region (2) and a diode region (3) are provided on
a semiconductor substrate (1) and have an emitter electrode
(16) on a surface of the semiconductor substrate (1). A sense
IGBT region (4) is provided on the semiconductor substrate
(1), has a smaller area than that of the IGBT region (2), and
includes a sense emitter electrode (20) provided on the
surface of the semiconductor substrate (1) and separated
from the emitter electrode (16). A sense diode region (3) is
provided on the semiconductor substrate (1), has a smaller
area than that of the diode region (3), and includes a sense
anode electrode provided on the surface of the semiconduc-
tor substrate (1) and separated from the emitter electrode
(16). The sense diode region (3) is separated from the IGBT
region (2) by a distance equal to or greater than that of the
drift layer (8).

6 Claims, 5 Drawing Sheets

(56) References Cited

U.S. PATENT DOCUMENTS

| | | | | |
|---|---|---|---|---|
| 2012/0043581 A1* | 2/2012 | Koyama | H10D 8/422 | 257/140 |
| 2013/0009206 A1* | 1/2013 | Soeno | H10D 62/393 | 257/140 |
| 2015/0249083 A1* | 9/2015 | Okawara | H10D 62/127 | 257/140 |
| 2015/0263144 A1* | 9/2015 | Misu | H10D 62/142 | 257/139 |
| 2015/0380536 A1* | 12/2015 | Kimura | H10D 12/481 | 257/144 |
| 2016/0372584 A1* | 12/2016 | Kimura | H10D 12/481 | |
| 2018/0350960 A1 | 12/2018 | Naito | | |
| 2021/0359677 A1* | 11/2021 | Miura | H03K 17/16 | |
| 2021/0384333 A1 | 12/2021 | Sato et al. | | |

FOREIGN PATENT DOCUMENTS

| | | | | |
|---|---|---|---|---|
| JP | WO2015118714 A1 * | 8/2015 | ............ | H01L 29/78 |
| JP | 2019-068036 A | 4/2019 | | |
| WO | 2015/118714 A1 | 8/2015 | | |

OTHER PUBLICATIONS

An Office Action; mailed by the China National Intellectual Property Administration of the People's Republic of China on May 1, 2026, which corresponds to Chinese Patent Application No. 202180097332.4 and is related to U.S. Appl. No. 18/254,665; with English language translation.

* cited by examiner

SEMICONDUCTOR DEVICE

FIELD

The present disclosure relates to a semiconductor device.

BACKGROUND

A reverse conducting insulated gate bipolar transistor (RC-IGBT) is widely used in a power conversion device such as an inverter. In recent years, an element size of an RC-IGBT to be mounted has become smaller for the purpose of making an inverter smaller and reducing cost. If an area ratio of an IGBT region is increased to reduce a conduction loss and a switching loss, a diode region becomes relatively narrow. This results in exceeding a peak surge forward current of a diode upon reflux, which may cause breakage. Thus, it has been proposed to provide a sense diode region that monitors a conduction current of the diode and to detect application of a current that leads to breakage (see, for example, PTL 1).

CITATION LIST

Patent Literature

[PTL 1] JP 2009-135414 A

SUMMARY

Technical Problem

However, there is a problem in a semiconductor device in related art that current detection accuracy in a sense diode region is low.

The present disclosure has been made to solve the problem as described above, and an object thereof is to provide a semiconductor device in which current detect accuracy in a sense diode region can be improved.

Solution to Problem

A semiconductor device according to the present disclosure includes: a semiconductor substrate including a drift layer; an IGBT region and a diode region which are provided on the semiconductor substrate and have an emitter electrode provided on a surface of the semiconductor substrate; a sense IGBT region provided on the semiconductor substrate, having a smaller area than an area of the IGBT region, and including a sense emitter electrode provided on the surface of the semiconductor substrate and separated from the emitter electrode; and a sense diode region provided on the semiconductor substrate, having a smaller area than an area of the diode region, and including a sense anode electrode provided on the surface of the semiconductor substrate and separated from the emitter electrode, wherein the sense diode region is separated from the IGBT region by a distance equal to or greater than a thickness of the drift layer.

Advantageous Effects of Invention

In the present disclosure, the sense diode region is separated from the IGBT region and the sense IGBT region by a distance equal to or greater than a thickness of the drift layer. This can prevent a current from flowing through the IGBT region upon reflux operation, so that it is possible to improve current detection accuracy in the sense diode region.

DESCRIPTION OF EMBODIMENTS

A semiconductor device according to the embodiments of the present disclosure will be described with reference to the drawings. The same components will be denoted by the same symbols, and the repeated description thereof may be omitted.

First Embodiment

Figure 1:
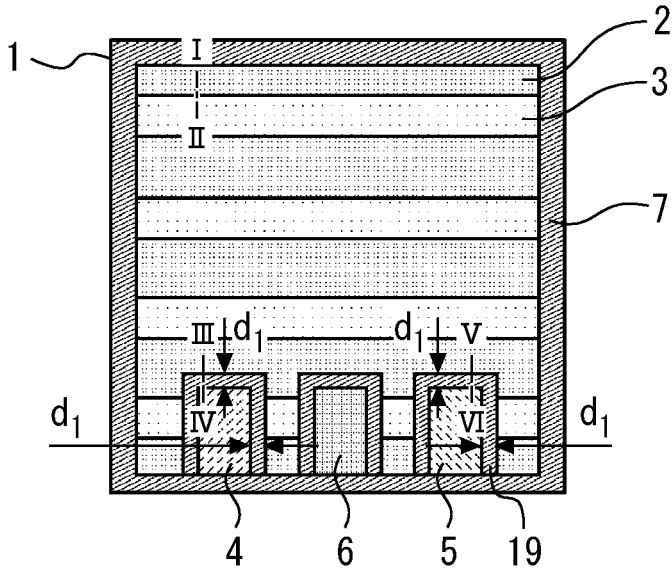
FIG. 1 is a plan view illustrating a semiconductor device according to a first embodiment.

FIG. 1 is a plan view illustrating a semiconductor device according to a first embodiment. The semiconductor device is an RC-IGBT in which an IGBT region 2 and a diode region 3 are provided on one semiconductor substrate 1. A sense IGBT region 4, a sense diode region 5 and a gate pad 6 are provided on the semiconductor substrate 1. A termination region 7 is provided on an outer periphery of the semiconductor substrate 1 so as to enclose these regions.

Figure 2:
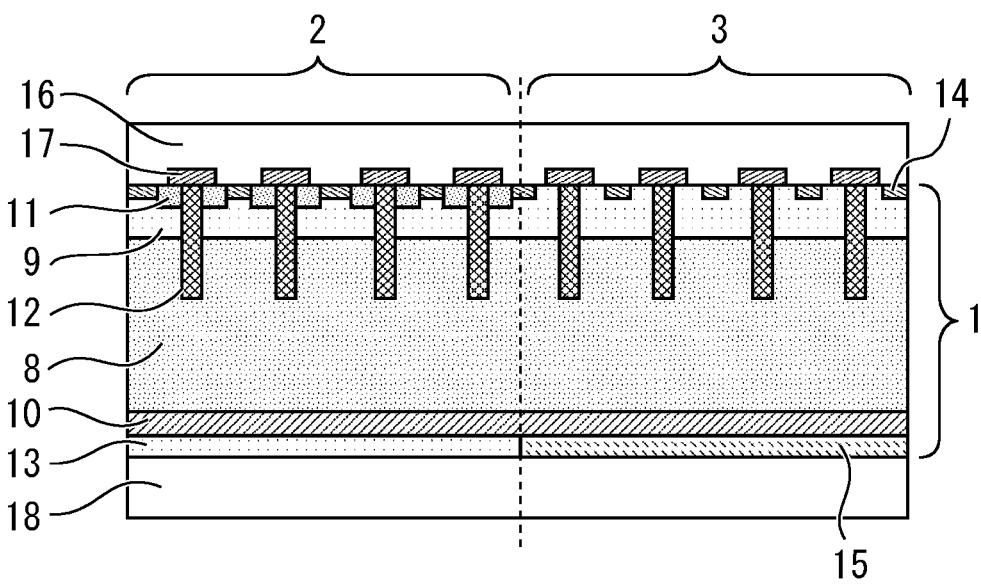
FIG. 2 is a cross-sectional diagram along I-II in FIG. 1.

FIG. 2 is a cross-sectional diagram along I-II in FIG. 1. The semiconductor substrate 1 includes an N-type drift layer 8. A P-type body layer 9 is provided on the drift layer 8. An N-type buffer layer 10 is provided under the drift layer 8.

In the IGBT region 2, an N-type emitter layer 11 is provided on a surface layer of the P-type body layer 9. Trench gates 12 are provided via a gate insulating film within trenches that pass through the N-type emitter layer 11 and the P-type body layer 9. A P-type collector layer 13 is provided under the N-type buffer layer 10. The trench gates 12 are connected to the gate pad 6 to connect to a gate power supply.

In the diode region 3, a P-type anode layer 14 is provided in a surface layer of the P-type body layer 9. The trench gates 12 are provided via the gate insulating film within the trenches that pass through the P-type body layer 9. An N-type cathode layer 15 is provided under the N-type buffer layer 10.

In both the IGBT region 2 and the diode region 3, an emitter electrode 16 is provided on a surface of the semiconductor substrate 1. The emitter electrode 16 is connected to the P-type body layer 9, the N-type emitter layer 11 and the P-type anode layer 14. An insulating film 17 is provided on the trench gates 12 to achieve insulation between the trench gates 12 and the emitter electrode 16. In both the IGBT region 2 and the diode region 3, a collector electrode 18 is provided on a back surface of the semiconductor substrate 1. The collector electrode 18 is connected to the P-type collector layer 13 and the N-type cathode layer 15.

Figure 3:
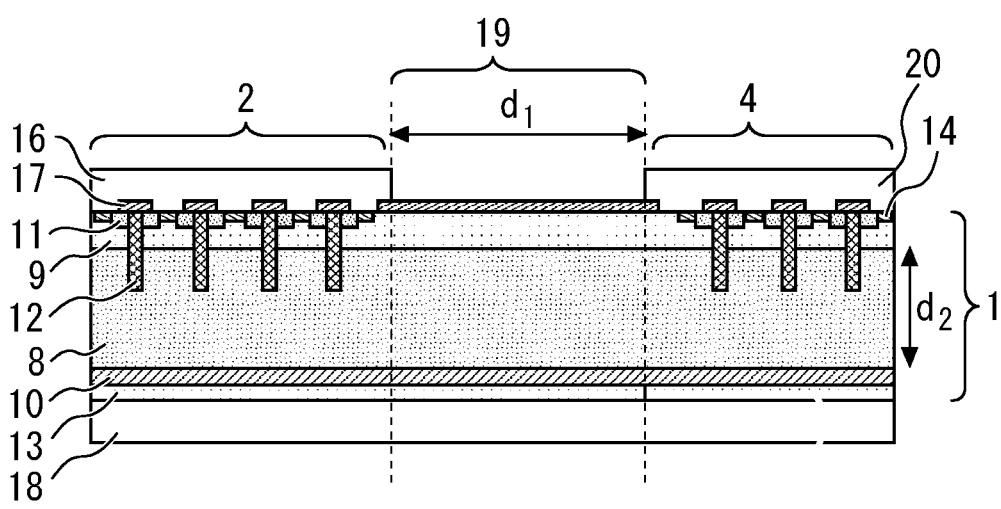
FIG. 3 is a cross-sectional diagram along III-IV in FIG. 1.

FIG. 3 is a cross-sectional diagram along III-IV in FIG. 1. A structure of the sense IGBT region 4 is similar to a structure of the IGBT region 2. In the sense IGBT region 4, a sense emitter electrode 20 provided on the surface of the semiconductor substrate 1 is connected to the P-type body layer 9 and the N-type emitter layer 11 and is separated from the emitter electrode 16. A separation region 19 is present between the IGBT region 2 and the sense IGBT region 4. The separation region 19 is a region where none of the N-type emitter layer 11, the P-type anode layer 14 and the trench gate 12 is present. The sense IGBT region 4 is provided only immediately under the sense emitter electrode 20.

Figure 4:
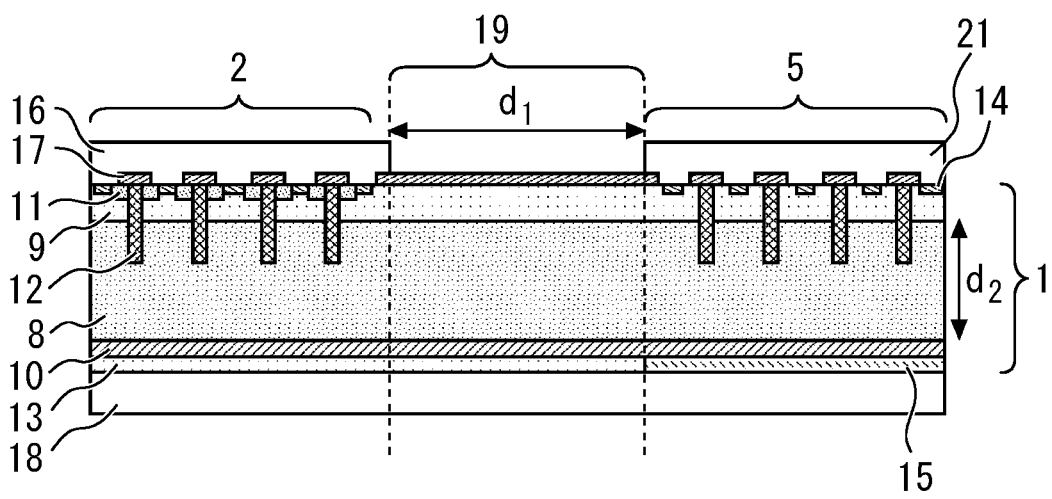
FIG. 4 is a cross-sectional diagram along V-VI in FIG. 1.

FIG. 4 is a cross-sectional diagram along V-VI in FIG. 1. A structure of the sense diode region 5 is similar to a structure of the diode region 3. In the sense diode region 5, a sense anode electrode 21 provided on the surface of the semiconductor substrate 1 is connected to the P-type body layer 9 and the P-type anode layer 14 and is separated from the emitter electrode 16. The sense diode region 5 is provided only immediately under the sense anode electrode 21.

A sum SI of an area of the IGBT region 2 is greater than a sum SD of an area of the diode region 3 (SI>SD). An area SSI of the sense IGBT region 4 is smaller than the sum SI of the area of the IGBT region 2 (SI>SSI). An area SSD of the sense diode region 5 is smaller than the sum SD of the area of diode region 3 (SD>SSD).

Figure 5:
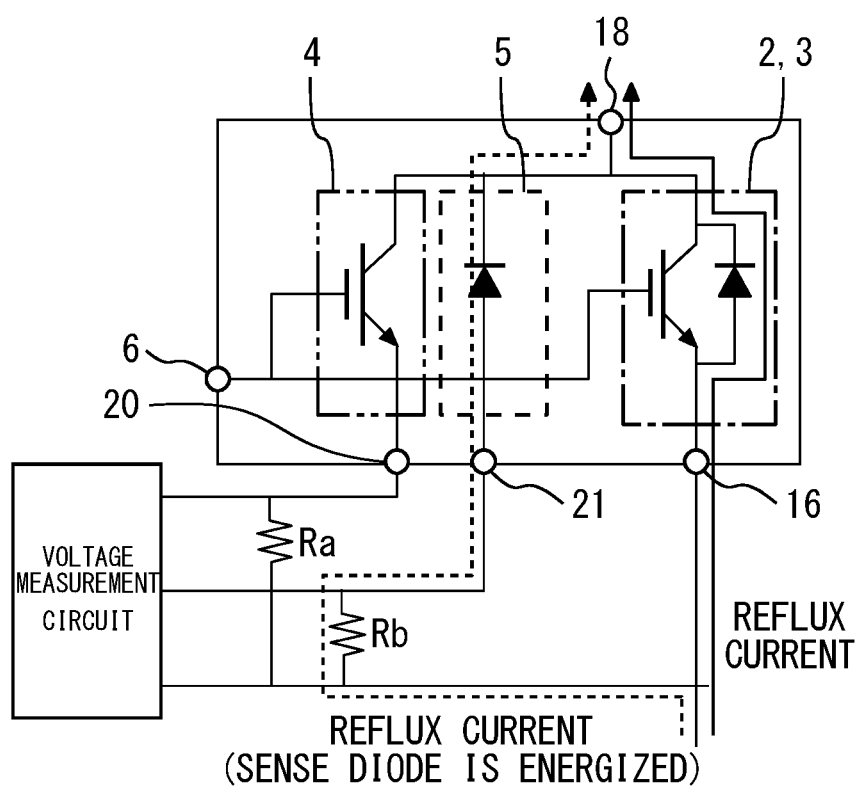
FIG. 5 is a view illustrating a diode current detection circuit.

FIG. 5 is a view illustrating a diode current detection circuit. The sense emitter electrode in the sense IGBT region 4 is connected to the emitter electrode 16 in a main portion including the IGBT region 2 and the diode region 3 via a sense resistor Ra. The sense anode electrode 21 in the sense diode region 5 is connected to the emitter electrode 16 in the main portion via a sense resistor Rb.

A current corresponding to an area ratio of the IGBT region 2 and the sense IGBT region 4 flows through the resistor Ra. Thus, by measuring a voltage between terminals of the sense emitter electrode 20 in the sense IGBT region 4 and the emitter electrode 16 in the IGBT region 2, a current flowing through the IGBT region 2 can be detected.

A current corresponding to an area ratio of the diode region 3 and the sense diode region flows through the resistor Rb. Thus, by measuring a voltage Vb between terminals of the sense anode electrode 21 in the sense diode region 5 and the emitter electrode 16 in the IGBT region 2, a current ID flowing through the diode region 3 can be detected. For example, the current ID is expressed as follows using Vb, SD, SSD and Rb.

$$ID=(Vb/Rb)*(SD/SSD)$$

In a similar manner, Vb is expressed as follows.

$$Vb=Rb*ID*(SSD/SD)$$

Thus, by a voltage measurement circuit measuring Vb, ID can be detected.

By monitoring a current in the diode region 3 using the sense diode region 5, an overcurrent in the diode region 3 can be detected and fed back to a protection function. A current flows through the drift layer 8 within a range inclined at 45 degrees from the back surface of the substrate upon reflux operation. If this current flows through the IGBT region 2 and the sense IGBT region 4, current detection accuracy in the sense diode region 5 degrades. Thus, in the present embodiment, the sense diode region 5 is separated from the IGBT region 2 and the sense IGBT region 4 by a distance equal to or greater than a thickness of the drift layer

8. This can prevent a current from flowing through the IGBT region 2 upon reflux operation, so that it is possible to improve current detection accuracy in the sense diode region 5.

Further, by the sense diode region 5 being separated from the sense IGBT region 4 by a distance equal to or greater than the thickness of the drift layer 8, the current detection accuracy in the sense diode region 5 is further improved.

Further, a width d1 of the separation region 19 that separates the IGBT region 2 from the sense IGBT region 4 is greater than a thickness d2 of the drift layer 8 (d1>d2). In other words, the sense IGBT region 4 is separated from the IGBT region 2 by a distance equal to or greater than the thickness of the drift layer 8. This prevents a current from flowing through the IGBT region 2 and improves current detection accuracy in the sense IGBT region 4.

Second Embodiment

Figure 6:
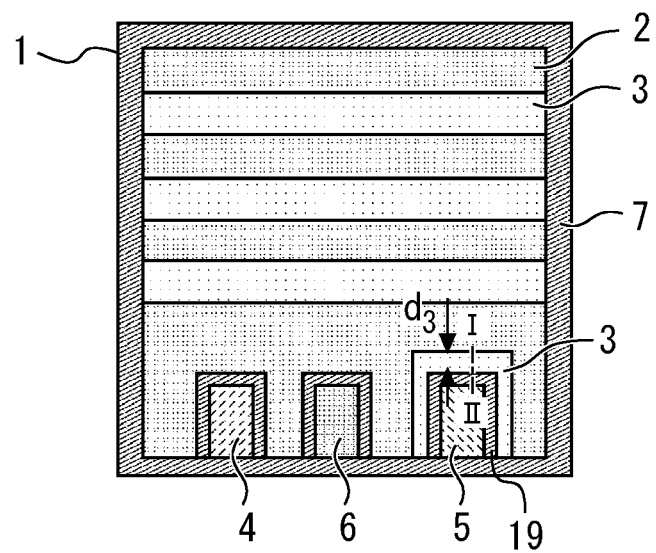
FIG. 6 is a top view illustrating a semiconductor device according to a second embodiment.
Figure 7:
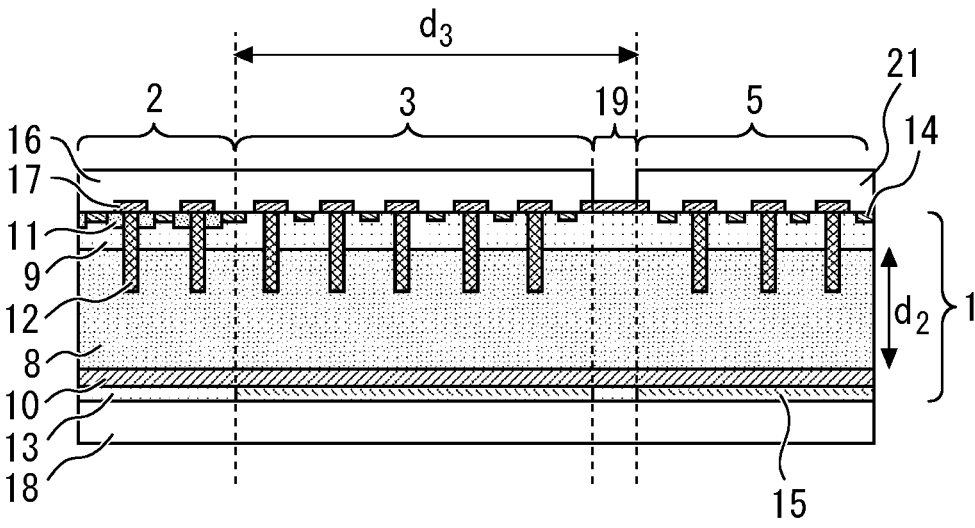
FIG. 7 is a cross-sectional diagram along I-II in FIG. 6.

FIG. 6 is a top view illustrating a semiconductor device according to a second embodiment. FIG. 7 is a cross-sectional diagram along I-II in FIG. 6. In the present embodiment, the diode region 3 is positioned around the sense diode region 5. If a distance from an outer end portion of the sense diode region 5 to a boundary of the diode region 3 that encloses the sense diode region 5, and the IGBT region 2 is set at d3, d3>d1.

While it is necessary to separate the sense diode region 5 from the IGBT region 2, if the separation region 19 is used as a region for separation, a region that contributes to energization of the semiconductor device decreases. Thus, in the present embodiment, the diode region 3 is positioned in a region within the thickness of the drift layer 8 from the sense diode region 5. Upon reflux operation, reflux operation is performed also in the diode region 3 around the sense diode region 5. Thus, a current flowing through the sense diode region 5 can be secured without a wide separation region 19 that does not contribute to energization being provided. It is therefore possible to improve the current detection accuracy in the sense diode region 5, so that it is possible to make the semiconductor device smaller by narrowing the separation region 19.

Note that the separation region 19 is a region with no P-type anode layer 14, or the like, so that it is necessary to separate an anode in the diode region 3 from an anode in the sense diode region 5 in terms of potential. It is assumed that a potential difference between the diode region 3 and the sense diode region 5 increases by several V by addition of a sense resistor, and thus, a width of the separation region 19 is set at equal to or greater than 20 μm.

Third Embodiment

Figure 8:
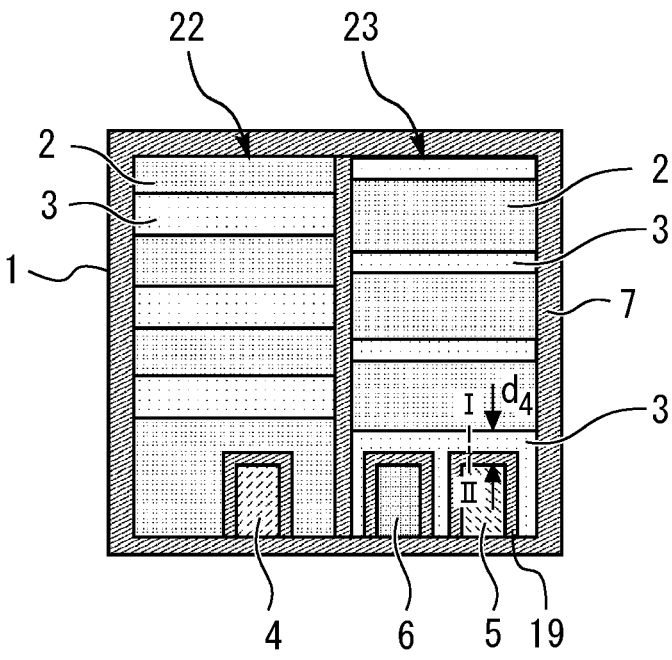
FIG. 8 is a top view illustrating a semiconductor device according to a third embodiment.
Figure 9:
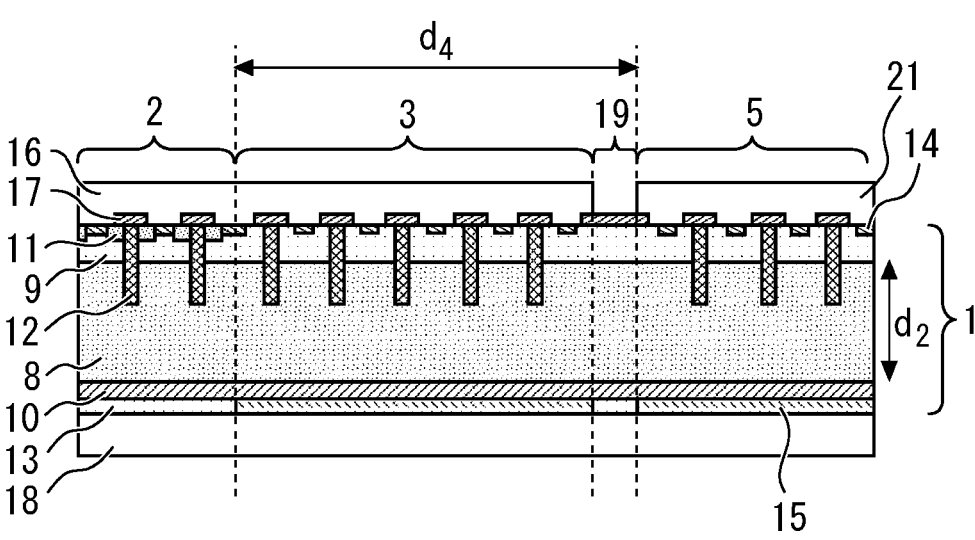
FIG. 9 is a cross-sectional diagram along I-II in FIG. 8.

FIG. 8 is a top view illustrating a semiconductor device according to a third embodiment. FIG. 9 is a cross-sectional diagram along I-II in FIG. 8. The IGBT region 2 and the diode region 3 are alternately arranged in a stripe shape along the trench gates 12 in a plan view. The semiconductor substrate 1 is divided into two or more regions including a first region 22 and a second region 23. The first region 22 and the second region 23 are adjacent to each other in an extension direction of the trench gates 12. The trench gates 12 and a diffusion layer, or the like, are split between the adjacent regions. Repetition of the IGBT region 2 and the diode region 3 is reverse between the first region 22 and the second region 23. By this means, the IGBT regions 2 that mainly generate heat by inverter operation are positioned away from each other, which prevents heat generation in the whole semiconductor device, so that it is possible to improve energization ability.

It is desirable that the IGBT region 2 is positioned around the sense IGBT region 4, and the diode region 3 is positioned around the sense diode region 5. However, in a case where the sense IGBT region 4 and the sense diode region 5 are positioned in the same region, one trench gate 12 is provided both in the IGBT region 2 and the diode region 3 in a region around the sense IGBT region 4 and the sense diode region 5. In this case, the trench gate 12 cannot be grounded on the emitter. Thus, capacitance is held in the diode region 3, which increases input capacitance and feedback capacitance of the semiconductor device.

Thus, the sense IGBT region 4 is positioned in the IGBT region 2 of the first region 22, and the sense diode region 5 is positioned in the diode region 3 of the second region 23. The IGBT region 2 of the first region 22 in which the sense IGBT region 4 is positioned is adjacent to the diode region 3 of the second region 23 in which the sense diode region 5 is positioned. The trench gates 12 respectively provided in the IGBT region 2 of the first region 22 and the diode region 3 of the second region 23 which are adjacent to each other are not connected to each other. It is therefore possible to prevent increase in capacitance by making the trench gate 12 provided in the diode region 3 grounded on the emitter. As a result of this, the input capacitance and the feedback capacitance of the semiconductor device are only held in the IGBT region, so that it is possible to reduce a switching loss and make the semiconductor device smaller.

Further, if a distance from the outer end portion of the sense diode region 5 to a boundary of the diode region 3 that encloses the sense diode region 5, and the IGBT region 2 is set at d4, d4>d1. This can improve the current detection accuracy of the sense diode region 5 and can make the semiconductor device smaller by narrowing the separation region 19 in a similar manner to the second embodiment.

The semiconductor substrate 1 is not limited to a semiconductor substrate formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

REFERENCE SIGNS LIST

1 semiconductor substrate; 2 IGBT region; 3 diode region; 4 sense IGBT region; 8 drift layer; 16 emitter electrode; 20 sense emitter electrode; 22 first region; 23 second region

The invention claimed is:

1. A semiconductor device comprising:
a semiconductor substrate including a drift layer;
an IGBT region and a diode region which are provided on the semiconductor substrate and have an emitter electrode provided on a surface of the semiconductor substrate;
a sense IGBT region provided on the semiconductor substrate, having a smaller area than an area of the IGBT region, and including a sense emitter electrode provided on the surface of the semiconductor substrate and separated from the emitter electrode; and
a sense diode region provided on the semiconductor substrate, having a smaller area than an area of the diode region, and including a sense anode electrode provided on the surface of the semiconductor substrate and separated from the emitter electrode,
wherein the sense diode region is separated from the IGBT region by a distance equal to or greater than a thickness of the drift layer,
wherein the sense diode region in a top view is positioned within the IGBT region and bounded on three sides by the diode region.

2. The semiconductor device according to claim 1, wherein the diode region is positioned in a region within the thickness of the drift layer from the sense diode region.

3. The semiconductor device according to claim 2, wherein the semiconductor substrate is divided into a first region and a second region,
the IGBT region and the diode region include a trench gate,
the IGBT region and the diode region are alternately arranged in a stripe shape along the trench gate in a plan view,
repetition of the IGBT region and the diode region is reverse between the first region and the second region,
the sense IGBT region is positioned in the IGBT region of the first region, and
the sense diode region is positioned in the diode region of the second region.

4. The semiconductor device according to claim 1, wherein the sense diode region is separated from the sense IGBT region by a distance equal to or greater than the thickness of the drift layer.

5. The semiconductor device according to claim 1, wherein the sense IGBT region is separated from the IGBT region by a distance equal to or greater than the thickness of the drift layer.

6. The semiconductor device according to claim 1, wherein the semiconductor substrate is formed of a wide-bandgap semiconductor.

* * * * *